(12) United States Patent
Kim

(10) Patent No.: US 11,409,196 B2
(45) Date of Patent: Aug. 9, 2022

(54) METHOD FOR FORMING PATTERNS

(71) Applicant: SK hynix Inc., Icheon (KR)

(72) Inventor: Keun-Jun Kim, Suwon (KR)

(73) Assignee: SK hynix Inc., Icheon (KR)

( * ) Notice: Subject to any disclaimer, the term of this patent is extended or adjusted under 35 U.S.C. 154(b) by 342 days.

(21) Appl. No.: 16/677,425

(22) Filed: Nov. 7, 2019

(65) Prior Publication Data

US 2020/0387070 A1  Dec. 10, 2020

(30) Foreign Application Priority Data

Jun. 10, 2019 (KR) .................. 10-2019-0067796

(51) Int. Cl.

| | |
|---|---|
| *G03F 7/09* | (2006.01) |
| *G03F 7/16* | (2006.01) |
| *G03F 7/20* | (2006.01) |
| *G03F 7/26* | (2006.01) |
| *G03F 7/038* | (2006.01) |
| *G03F 7/039* | (2006.01) |
| *G03F 7/38* | (2006.01) |
| *H01L 21/027* | (2006.01) |
| *H01L 21/311* | (2006.01) |
| *H01L 21/3213* | (2006.01) |

(52) U.S. Cl.
CPC .............. *G03F 7/094* (2013.01); *G03F 7/038* (2013.01); *G03F 7/039* (2013.01); *G03F 7/162* (2013.01); *G03F 7/168* (2013.01); *G03F 7/2004* (2013.01); *G03F 7/26* (2013.01); *G03F 7/38* (2013.01); *H01L 21/0271* (2013.01); *H01L 21/0274* (2013.01); *H01L 21/31144* (2013.01); *H01L 21/32139* (2013.01)

(58) Field of Classification Search
CPC .... G03F 7/2016; G03F 7/2022; G03F 7/0002; G03F 7/70383; G03F 7/20; G03F 7/70275; G03F 7/70291; G03F 7/094; G03F 7/038; G03F 7/039; G03F 7/162; G03F 7/168; G03F 7/2004; G03F 7/26; G03F 7/38; H01L 21/0273; H01L 21/3086; H01L 21/3088; H01L 21/0271; H01L 21/0274; H01L 21/31144; H01L 21/32139
USPC ........................ 430/320, 270.1; 438/700, 311
See application file for complete search history.

(56) References Cited

U.S. PATENT DOCUMENTS

| | | | |
|---|---|---|---|
| 8,900,467 B1 | 12/2014 | Chapuis et al. | |
| 9,411,237 B2 | 8/2016 | Xie et al. | |
| 9,786,511 B2 | 10/2017 | Darling et al. | |
| 2006/0073422 A1* | 4/2006 | Edwards | G11B 23/0085 430/320 |
| 2015/0185615 A1 | 7/2015 | Park et al. | |
| 2016/0029272 A1* | 1/2016 | Ye | H04W 48/02 455/436 |
| 2018/0173109 A1 | 6/2018 | Gronheid et al. | |

* cited by examiner

*Primary Examiner* — Caleen O Sullivan

(57) ABSTRACT

Disclosed is a method for forming patterns that can improve line width roughness (LWR) by forming a first resist material on an etch target layer, forming a second resist material including a light-shielding portion and a light-transmitting portion on the first resist material, exposing the first resist material using the light-shielding portion of the second resist material as an exposure mask, removing the second resist material, forming a first resist pattern by developing the exposed first resist material, and etching the etch target layer using the first resist pattern as an etch barrier.

16 Claims, 7 Drawing Sheets

METHOD FOR FORMING PATTERNS

CROSS-REFERENCE TO RELATED APPLICATIONS

The present application claims priority to Korean Patent Application No. 10-2019-0067796, filed on Jun. 10, 2019, which is incorporated herein by reference in its entirety.

BACKGROUND

1. Field

Exemplary embodiments relate to a method for fabricating a semiconductor device, and more particularly, to a method for forming patterns on a semiconductor device.

2. Description of the Related Art

In a semiconductor device fabrication process, there is a need to miniaturize patterns for the purpose of achieving higher degrees of integration and miniaturization of a semiconductor device.

Photolithography is a method used to fabricate patterns by transferring geometric shapes and patterns on a mask to a target layer.

SUMMARY

Exemplary embodiments of the present disclosure are directed to a method for forming patterns that may improve line width roughness (LWR) of the patterns.

In accordance with an embodiment, a method for forming patterns includes forming a first resist material on an etch target layer, forming a second resist material including a light-shielding portion and a light-transmitting portion on the first resist material, exposing the first resist material using the light-shielding portion of the second resist material as an exposure mask, removing the second resist material, forming a first resist pattern by developing the exposed first resist material, and etching the etch target layer using the first resist pattern as an etch barrier.

In accordance with an embodiment, a method for forming patterns includes forming a hard mask layer on an etch target layer, forming photoresist on the hard mask layer, forming a neutral layer on the photoresist, forming a direct self-assembly (DSA) material, in which a plurality of light-transmitting polymer patterns and a plurality of light-shielding polymer patterns are self-assembled, on the neutral layer, exposing the photoresist by performing a blanket exposure process using the light-transmitting polymer patterns as an exposure mask, forming a photoresist pattern by developing an exposure portion of the photoresist, and patterning the hard mask layer through the photoresist pattern.

DETAILED DESCRIPTION

Various embodiments of the present disclosure are described below in more detail with reference to the accompanying drawings. These embodiments are provided so that this disclosure is thorough and complete, and fully conveys the scope of the claims to those skilled in the art.

In the embodiments to be described below, there is provided a method of forming line and space-shaped patterns using phase separation of a block copolymer (BCP). Some embodiments are directed to a method of forming an array of hole patterns such as contact holes, using phase separation of the BCP. Patterns having a line width less than a resolution limit of a lithography exposure process may be formed using a direct self-assembly (DSA) process that uses phase separation of the BCP. Specific polymer blocks of the BCP may be ordered and phase-separated to form distinct domain portions, and the phase-separated domain portions may be selectively removed to form feature patterns having a nano-scale line width. A nano-scale feature may refer to a structure having a size of a few nanometers to several tens of nanometers.

A self-assembled structure of the BCP may be phase-separated into structures having a cylindrical shape or a lamellar shape according to a volume ratio, a temperature, molecule sizes and molecular weights of polymer blocks constituting the BCP. More specifically, phase separated domain portions of the polymer blocks may have, for example, cylindrical shapes or lamellar shapes, so that the polymer phases define a plurality of lines or cylinders on a substrate. A self-assembled structure having polymer phase-separated into cylindrical shapes may be used to form an array of hole patterns, and a self-assembled structure that is phase separated into lamellar shapes may be used to form repeating line and space-shaped patterns.

DSA patterning can achieve patterns with a half pitch of 20 nm or less without the use of light. However, DSA patterning alone has a disadvantage that line width roughness (LWR) of the patterns is poor compared to LWR of shapes formed using photolithography using light such as deep ultra violet (DUV) or extreme ultra violet (EUV).

Thus, according to embodiments, patterns may be formed by a combination of DSA patterning and DUV photolithography. The patterns having a half pitch of 20 nm or less can be formed by DSA patterning and the LWR of the patterns may be improved by DUV exposure. An exposure mask for the DUV photolithography may be formed by a DSA patterning.

FIGS. 1A to 1F are cross-sectional views illustrating a method for forming patterns of a semiconductor device in accordance with an embodiment.

Figure 1A:
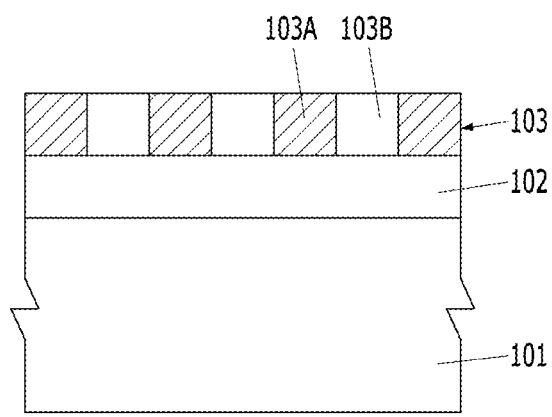
FIGS. 1A to 1F are cross-sectional views illustrating a method for forming patterns on a semiconductor device in accordance with an embodiment.

As illustrated in FIG. 1A, an etch target layer 101 may be prepared. The etch target layer 101 may include a semiconductor substrate, a conductive material, a dielectric material or combinations thereof. The etch target layer 101 may include a silicon substrate, silicon oxide, silicon nitride, a metal, metal nitride, metal oxide, metal silicide or combinations thereof. For example, the etch target layer 101 may include a stacked layer of a semiconductor substrate and silicon oxide.

A first resist material 102 may be formed on the etch target layer 101. The first resist material 102 may include photoresist. The first resist material 102 may include a material that can be removed by being developed after being exposed to a light source. For example, the first resist material 102 may include photoresist such as a deep ultra-violet (DUV) photoresist.

A second resist material 103 may be formed on the first resist material 102. The second resist material 103 may be formed by a spin coating process and exposed by an annealing process performed after the spin coating process. The second resist material 103 may be a different material from the first resist material 102. The second resist material 103 may include a light-transmitting material capable of transmitting light. For example, the second resist material 103 may include a DSA material. The second resist material 103 may include a light-transmitting copolymer material. The second resist material 103 may be a block copolymer formed by copolymerizing two or more different types of polymer components, that is, a first polymer component 103A and a second polymer component 103B. The first and second polymer components 103A and 103B may be configured to cause phase separation by simply performing the annealing process. In other words, the block copolymer may separate the different polymer blocks into separate phases when the copolymer is provided with thermal energy through an annealing process.

The second resist material 103 may be formed by binding two kinds of polymers having different molecular weights. For example, the first polymer component 103A may include polymethylmethacrylate (PMMA) in a first block, and the second polymer component 103B may include polystyrene (PS) in a second block.

The second resist material 103 may be phase-separated into the first polymer component 103A and the second polymer component 103B by the annealing process. When the second resist material 103 includes a block copolymer, the second resist material 103 may be separated into separate PMMA phases and PS phases by the annealing process, and the PMMA and PS may be self-aligned in various shapes according to a ratio at which the two blocks are present in the copolymer. In some embodiments, the PMMA and PS may be self-aligned at regular intervals to form a regular repeating structure. The second resist material 103 may be referred to as "a self-assembled block copolymer.

Such a series of processes, that is, coating and annealing of the second resist material 103, may be referred to as "DSA patterning". DSA patterning may include coating process of the block copolymer and annealing the block copolymer to form self-assembled block copolymer. The self-assembled block copolymer may include the PMMA and the PS.

Figure 1B:
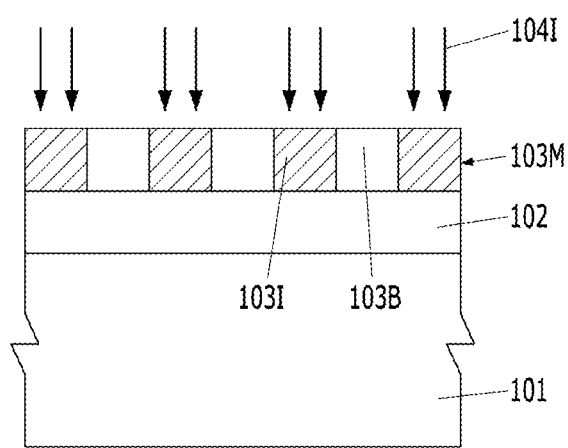

As illustrated in FIG. 1B, a metal-containing precursor 1041 may be introduced into the second resist layer 103. The metal-containing precursor 1041 may be a precursor that includes a metal material. The metal-containing precursor 1041 may have a characteristic of selectively binding to only one of the polymer components of the second resist material 103. For example, the metal of the metal-containing precursor 1041 may selectively bind to the first polymer component 103A. The metal-containing precursor 1041 may include aluminum. The metal-containing precursor 1041 may include tetramethylammonium (TMA). In an embodiment that uses a PS-PMMA block copolymer for the second resist material 103, the TMA may selectively bind to the PMMA block. For example, the TMA is introduced into Atomic Layer Deposition (ALD) chamber. PMMA contains carbonyl groups that react with the TMA, the TMA to infiltrate the PMMA.

As the metal-containing precursor 1041 is introduced, the metal material present in the precursor may be retained in the first polymer component 103A. Accordingly, the first polymer component 103A may be modified to become a metal-containing first polymer component 1031. The metal-containing first polymer component 1031 may change the susceptibility of the polymer component 103A to etching. As a result, the ratio of etch rates of the metal-containing first polymer component 1031 and the second polymer component 103B may be greater than the ratio between etch rates of the first polymer component 103A and the second polymer component 103B. In other words, the etch selectivity between the first polymer component 103A and the second polymer component 103B may be increased by introducing the metal-containing precursor 1041.

The metal-containing first polymer component 1031 may be a light-shielding polymer, and the second polymer component 103B may be a light-transmitting polymer. That is, in a subsequent exposure process, the metal-containing first polymer component 1031 may block light, and the second polymer component 130B may transmit light.

In some embodiments, the second resist material 103 may include other materials that bind to the TMA, in place of or in addition to PMMA.

Figure 1C:
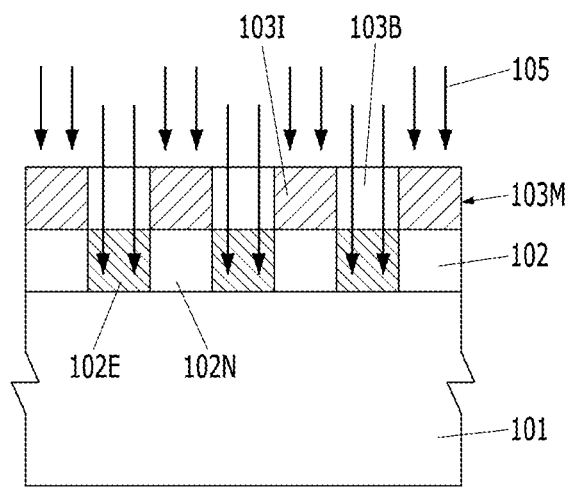

As illustrated in FIG. 1C, a blanket exposure process 105 may be performed. The blanket exposure process 105 may use a DUV light source. In the blanket exposure process 105, DUV light is directly irradiated onto the entire surface of first resist material 103 without using an additional mask.

A part of the first resist material 102 may be exposed by the blanket exposure process 105. The DUV light of the blanket exposure process 105 may penetrate the second polymer component 103B, and not penetrate the metal-containing first polymer component 1031. That is, the DUV light may be blocked by being absorbed or reflected by the metal-containing first polymer component 1031, preventing light from reaching portions of the first resist material 102 disposed below the first polymer components 1031.

As described above, during the blanket exposure process 105, the second resist material 103 may be used as an exposure mask, the metal-containing first polymer component 1031 of the second resist material 103 may block the exposure light, and the exposure light may penetrate second polymer component 103B.

After the blanket exposure process 105, the first resist material 102 may be separated into an exposed portion 102E and a non-exposure portion 102N. The exposed portion 102E may be the portion exposed by the DUV light, and the non-exposed portion 102N may be the portion where the DUV light is blocked.

Figure 1D:
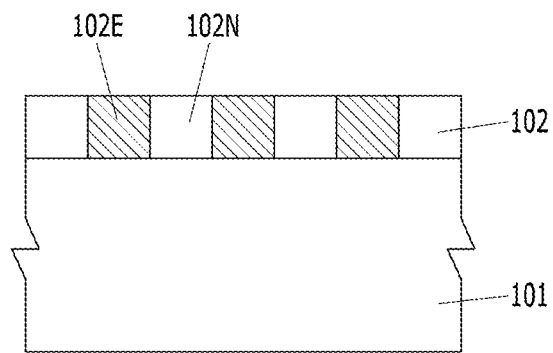

As illustrated in FIG. 1D, an ashing process may be performed. The second resist material 103 may be removed by the ashing process, thereby exposing the first resist material 102. The ashing process may include low power ashing.

Figure 1E:
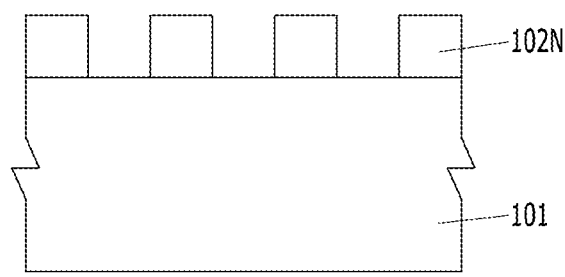

As illustrated in FIG. 1E, a post exposure bake (PEB) process and a development process may be performed. Accordingly, the exposed portion 102E may be removed, and the non-exposed portion 102N may remain. The non-exposed portion 102N may be referred to as a "first resist pattern 102N".

Figure 1F:
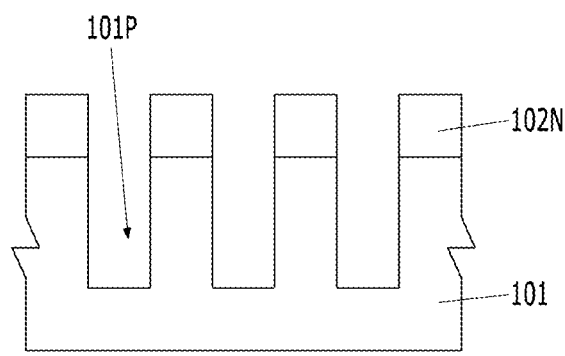

As illustrated in FIG. 1F, the etch target layer 101 may be etched using the first resist pattern 102N as an etch barrier. Accordingly, a pattern 101P may be formed in the etch target layer 101.

FIGS. 2A to 2G are cross-sectional views illustrating a method for forming patterns of a semiconductor device in accordance with an embodiment.

Figure 2A:
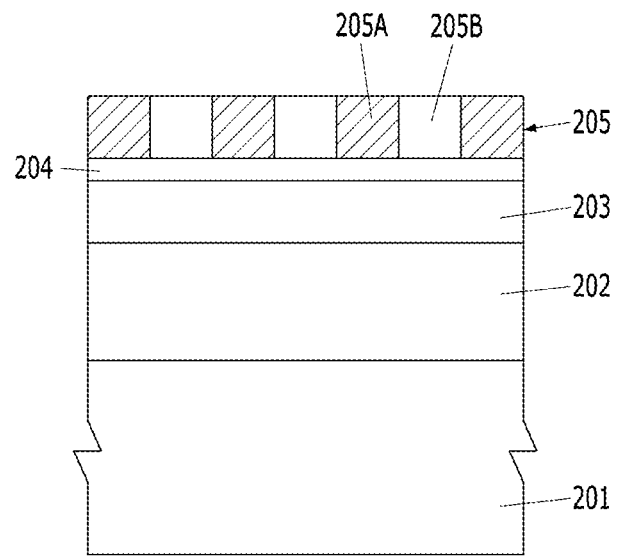
FIGS. 2A to 2G are cross-sectional views illustrating a method for forming patterns on a semiconductor device in accordance with an embodiment.

As illustrated in FIG. 2A, a hard mask layer 202 may be formed on an etch target layer 201. The etch target layer 201 may include a semiconductor substrate, a conductive material, a dielectric material or combinations thereof. The etch target layer 201 may include a silicon substrate, silicon oxide, silicon nitride, a metal, metal nitride, metal oxide, metal silicide or combinations thereof. For example, the etch target layer 201 may include a stacked layer of a semiconductor substrate and silicon oxide.

The hard mask layer 202 may be a material having an etch selectivity with respect to the etch target layer 201. The hard mask layer 202 may include silicon oxide, silicon nitride, a metal, metal nitride, metal oxide, metal silicide or combinations thereof. In some embodiments, the hard mask layer 202 may comprise multiple layers of materials having different etch selectivities.

A first resist material 203 may be formed on the hard mask layer 202. The first resist material 203 may include photoresist. The first resist material 203 may include a material that can be removed by being developed after being exposed by a light source. The first resist material 203 may include photoresist that is exposed by a DUV light source. The first resist material 203 may be referred to as "DUV photoresist".

A neutral layer 204 may be formed on the first resist material 203. The neutral layer 204 may induce pattern formation of a subsequent second resist material. The neutral layer 204 may induce respective polymer blocks of a block copolymer, which is formed over the neutral layer 204, to be phase-separated into block domain portions that are alternately repeated in shapes such as cylindrical shapes or lamellar shapes. The neutral layer 204 may serve as an orientation adjusting layer by inducing the block domain portions to be alternately repeated by adjusting the orientation of the polymer blocks in a phase separation process of re-ordering the respective polymer blocks to form the block domain portions. In other words, neutral layer 204 may help blocks of a copolymer that is deposited in a random orientation to separate into distinct phases.

The neutral layer 204 may be formed of a material having a similar affinity for each of polymer block components constituting the block copolymer. For example, the neutral layer 204 may include a random copolymer where a polymer block A component and a polymer block B component, which constitute the block copolymer, are randomly copolymerized. For example, when a polystyrene-polymethylmethacrylate block copolymer (PS-b-PMMA) is used as a self-aligned block copolymer, the neutral layer 204 may include a random copolymer of polystyrene and polymethylmethacrylate, that is, random PS: PMMA (PS-r-PMMA).

A second resist material 205 may be formed on the neutral layer 204. The second resist material 205 may be formed by a spin coating process and phase separated by an annealing process after the spin coating process. The second resist material 205 may be a different material from the first resist material 203. The second resist material 205 may include a DSA material. The second resist material 205 may be a block copolymer formed by copolymerizing two or more different types of polymer components, that is, a first polymer component 205A and a second polymer component 205B. The first and second polymer components 205A and 205B may be configured to cause phase separation by simply performing the annealing process.

The second resist material 205 may be formed by combining two different polymers having different molecular weights. For example, the first polymer component 205A may include polymethylmethacrylate (PMMA), and the second polymer component 205B may include polystyrene (PS).

The second resist material 205 may be phase-separated into the first polymer component 205A and the second polymer component 205B by the annealing process. When the second resist material 205 includes a block copolymer, the second resist material 205 may be separated into distinct PMMA and PS phases by the annealing process, and the PMMA and PS blocks may be self-aligned in various shapes according to a composition ratio of the copolymer. The PMMA and PS may be self-aligned at regular intervals to form structures with a regular and predictable arrangement.

Such a series of processes, that is, application and annealing of the second resist material 205, may be referred to as "DSA patterning".

Figure 2B:
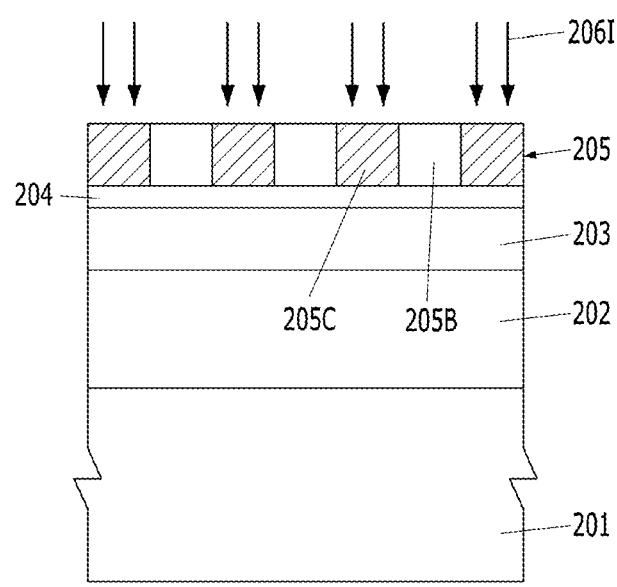

As illustrated in FIG. 2B, a metal-containing precursor 2061 may be introduced. The metal-containing precursor 2061 may be a precursor including a metal. The metal-containing precursor 2061 may have characteristics of selectively binding to only one polymer component of the second resist material 205. For example, the metal of the metal-containing precursor 2061 may selectively bind to the first polymer component 205A. The metal-containing precursor 2061 may include aluminum. The metal-containing precursor 2061 may include tetramethylammonium (TMA). In an embodiment that uses a PS-PMMA block copolymer for the second resist material 205, the TMA may selectively bind to PMMA of the block copolymer layer 205. For example, the TMA is introduced into Atomic Layer Deposition (ALD) chamber. PMMA contains carbonyl groups that react with the TMA, the TMA to infiltrate the PMMA.

As the metal-containing precursor 2061 is implanted, a metal may be introduced into the first polymer component 205A. Accordingly, the first polymer component 205A may be modified to become a metal-containing first polymer component 205C. The metal-containing first polymer component 205C may have an etch selectivity to the second polymer component 205B. As a result, the etch selectivity between the first polymer component 205C and the second polymer component 205B may be increased by introducing the metal-containing precursor 2061.

The metal-containing first polymer component 205C may be a light-shielding polymer, and the second polymer component 205B may be a light-transmitting polymer. That is, in the subsequent exposure process, the metal-containing first polymer component 205C may block the exposure light, and the second polymer component 205B may transmit the exposure light.

In some embodiments, the second resist material 205 may include other materials that can selectively bind to the TMA component of the metal-containing precursor 2061, in place of or in addition to the PMMA.

Figure 2C:
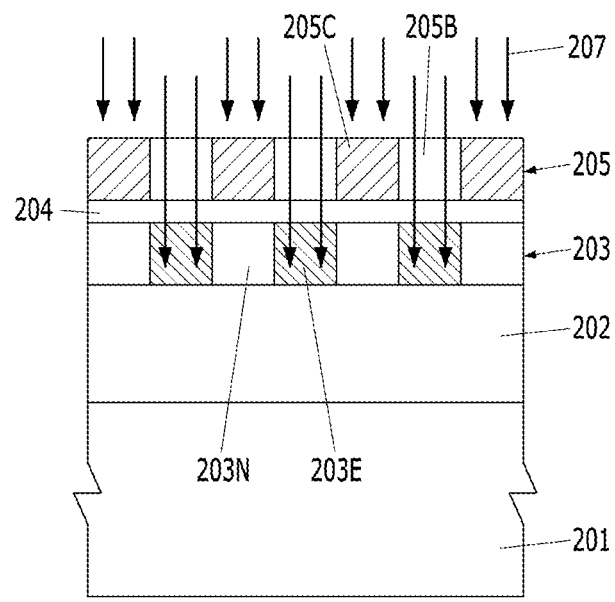

As illustrated in FIG. 2C, a blanket exposure process 207 may be performed. The blanket exposure process 207 may use a DUV light source that emits DUV light. In the blanket exposure process 207, the entire surface of second resist material 205 may be directly irradiated with the DUV light source without using an additional mask. The exposure light source may include an I-Line, KrF, ArF or EUV light source in addition to a DUV source. In some embodiments, the exposure light source may include a combination of two or more light sources.

A part of the first resist material 203 may be exposed by the blanket exposure process 207. The DUV light of the blanket exposure process 207 may penetrate the second polymer component 205B, and not penetrate the metal-containing first polymer component 205C. That is, the DUV light may be blocked by the metal-containing first polymer component 205C.

After the blanket exposure process 207, the first resist material 203 may be separated into an exposed portion 203E and a non-exposed portion 203N. The exposed portion 203E may be the portion of resist layer 203 exposed by the DUV light, and the non-exposed portion 203N may be the portion of layer 203 disposed under phases of the block polymer that block the DUV light.

Figure 2D:
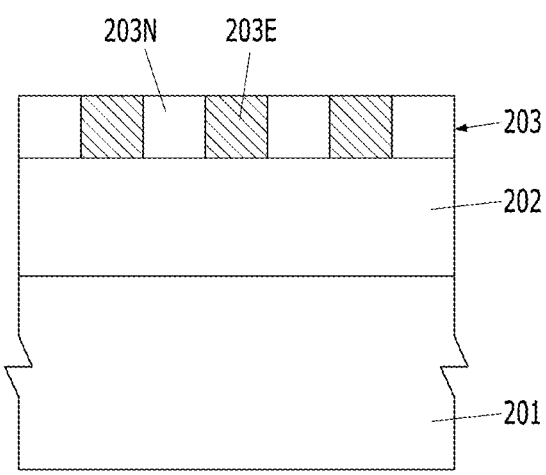

As illustrated in FIG. 2D, an ashing process may be performed. The second resist material 205 and the neutral layer 204 may be removed by the ashing process, and the first resist material 203 may be exposed. The ashing process may include low power ashing.

Figure 2E:
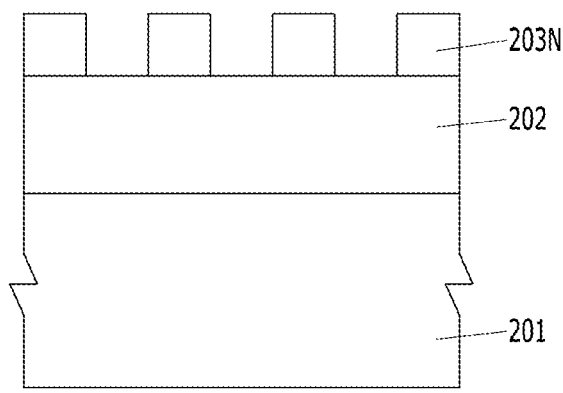

As illustrated in FIG. 2E, a post exposure bake (PEB) process and a development process may be performed. Accordingly, the exposed portion 203E of the first resist material 203 may be removed, and the non-exposed portion 203N may remain. The non-exposed portion 203N may be referred to as a "first resist pattern 203N".

Figure 2F:
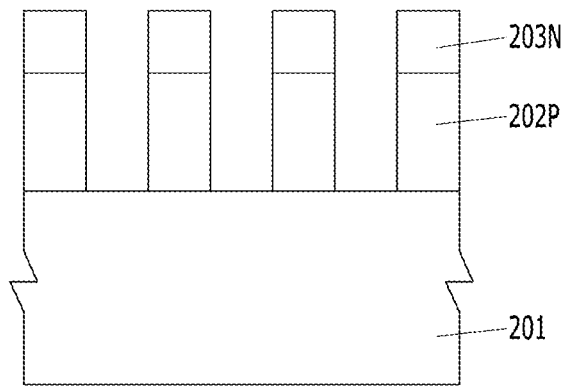

As illustrated in FIG. 2F, the hard mask layer 202 may be etched using the first resist pattern 203N as an etch barrier. Accordingly, a hard mask layer pattern 202P may be formed.

Figure 2G:
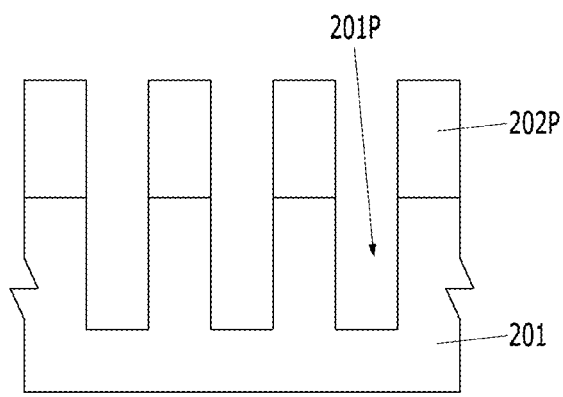

As illustrated in FIG. 2G, the first resist pattern 203N may be removed. The first resist pattern 203N may be removed by a strip process using oxygen plasma.

The etch target layer 201 may be etched using the hard mask layer pattern 202P. Accordingly, a pattern 201P may be formed in the etch target layer 201.

According to the embodiments described above, DSA patterning and DUV exposure can be combined, thereby forming a fine pattern of 20 nm or less with improved LWR.

The embodiments may be applied to implement a device such as a PCRAM device or a ReRAM device, which includes an array of small-sized nodes and wiring lines connected to the nodes in a cell region. The embodiments may also be applied to a memory device such as an SRAM, FLASH, MRAM or FeRAM, or a logic device in which a logic integrated circuit is integrated.

Although the embodiments discussed in this disclosure describe an example in which a block copolymer formed of PS and PMMA is used as a DSA material, the other DSA block copolymers in which a first polymer and a second polymer are present in distinct blocks may be used.

In an embodiment, since an exposure mask is formed by a DSA process, patterning with a half pitch of 20 nm or less may be implemented.

Embodiments of the present disclosure may improve the LWR of patterns using a combination of DSA patterning and DUV exposure.

According to embodiments, since a separate exposure mask is not used for the DUV exposure, the DUV exposure can be performed using only laser irradiation without the use of a scanner, thereby reducing fabrication costs.

While the present disclosure describes specific embodiments, it should be noted that the embodiments are only used to provide specific examples, and the specific examples should not be interpreted as limiting the scope of this disclosure. Further, it should be noted that other embodiments are possibly by substitution, change, and modification of elements of the embodiments discussed above by those skilled in the art without departing from the scope of the present disclosure.

What is claimed is:

1. A method for forming patterns comprising:
forming a first resist material on an etch target layer;
forming a second resist material including a light-shielding portion and a light-transmitting portion on the first resist material;
exposing the first resist material using the light-shielding portion of the second resist material as an exposure mask;
removing the second resist material;
forming a first resist pattern by developing the exposed first resist material; and
etching the etch target layer using the first resist pattern as an etch barrier,
wherein forming the second resist material including the light-shielding portion and the light-transmitting portion comprises:
forming a light-transmitting resist material on the first resist material; and
introducing a light-shielding material into the light-transmitting resist material to convert a part of the light-transmitting resist material into a light-shielding resist.

2. The method of claim 1, wherein the light-shielding material comprises a metal.

3. The method of claim 1, wherein the first resist material comprises photoresist.

4. The method of claim 1, wherein exposing the first resist material is performed by a blanket exposure process.

5. A method for forming patterns comprising:
forming a first resist material on an etch target layer;
forming a second resist material including a light-shielding portion and a light-transmitting portion on the first resist material;
exposing the first resist material using the light-shielding portion of the second resist material as an exposure mask;
removing the second resist material;
forming a first resist pattern by developing the exposed first resist material; and
etching the etch target layer using the first resist pattern as an etch barrier,
wherein forming the second resist material including the light-shielding portion and the light-transmitting portion comprises:
forming a self-assembled light-transmitting polymer comprising a first polymer component and a second polymer component on the first resist material; and
providing a precursor containing a light-shielding material to selectively convert the first polymer component into a light-shielding polymer,
wherein the precursor containing the light-shielding material is non-reactive to the second polymer component.

6. The method of claim 5, wherein the precursor containing the light-shielding material comprises a metal.

7. A method for forming patterns comprising:
forming a first resist material on an etch target layer;
forming a second resist material including a light-shielding portion and a light-transmitting portion on the first resist material;
exposing the first resist material using the light-shielding portion of the second resist material as an exposure mask;
removing the second resist material;
forming a first resist pattern by developing the exposed first resist material; and
etching the etch target layer using the first resist pattern as an etch barrier,
wherein forming the second resist material including the light-shielding portion and the light-transmitting portion comprises:
forming a block copolymer on the first resist material;
annealing the block copolymer to form a self-assembled block copolymer, the self-assembled block copolymer comprising first polymer components and second polymer components; and
converting the first polymer components of the self-assembled block copolymer into light-shielding polymers by exposing the first polymer components to a metal-containing precursor, wherein the metal-containing precursor is non-reactive to the second polymer components.

8. The method of claim 7, wherein the first polymer components comprise polymethylmethacrylate (PMMA), the second polymer components comprise polystyrene (PS), and the metal-containing precursor comprises a metal that binds to the PMMA.

9. The method of claim 8, wherein the metal-containing precursor comprises tetramethylammonium (TMA).

10. A method for forming patterns comprising:
forming a hard mask layer on an etch target layer;
forming photoresist on the hard mask layer;
forming a neutral layer on the photoresist;
forming a direct self-assembly (DSA) material, in which a plurality of light-transmitting polymer patterns and a plurality of light-shielding polymer patterns are self-assembled, on the neutral layer;
exposing the photoresist by performing a blanket exposure process using the light-transmitting polymer patterns as an exposure mask;
forming a photoresist pattern by developing an exposed portion of the photoresist; and
patterning the hard mask layer through the photoresist pattern.

11. The method of claim 10, wherein the forming of the DSA material comprises:

forming a light-transmitting block copolymer on the neutral layer;
annealing the light-transmitting block copolymer to form a self-assembled block copolymer, the self-assembled block copolymer comprising first polymer components and second polymer components; and
converting the first polymer components of the self-assembled block copolymer into the light-shielding polymer patterns by exposing the self-assembled block copolymer to a metal-containing precursor,
wherein the second polymer components are non-reactive to the metal-containing precursor to form the light-shielding polymer patterns.

12. The method of claim 11, wherein the first polymer components comprise PMMA, the second polymer components comprise PS, and the metal-containing precursor comprises a metal that binds to the PMMA.

13. The method of claim 12, wherein the metal-containing precursor comprises TMA.

14. The method of claim 10, wherein the photoresist comprises deep ultra violet (DUV) photoresist.

15. The method of claim 10, wherein the blanket exposure process is performed using a DUV light source.

16. The method of claim 10, further comprising etching the etch target layer using the patterned hard mask layer as an etch barrier after patterning the hard mask layer using the photoresist pattern.

* * * * *